US012598964B2

(12) United States Patent
Baillargeon et al.

(10) Patent No.: US 12,598,964 B2
(45) Date of Patent: Apr. 7, 2026

(54) HARDMASK INTEGRATION FOR HIGH ASPECT RATIO APPLICATIONS

(71) Applicant: Tokyo Electron Limited, Tokyo (JP)

(72) Inventors: Joshua Baillargeon, Albany, NY (US); Jinying Lin, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 250 days.

(21) Appl. No.: 18/382,447

(22) Filed: Oct. 20, 2023

(65) Prior Publication Data

US 2025/0132159 A1  Apr. 24, 2025

(51) Int. Cl.
*H01L 21/033* (2006.01)
*H01L 21/02* (2006.01)
*H01L 21/311* (2006.01)
*H01L 21/768* (2006.01)

(52) U.S. Cl.
CPC .... *H01L 21/0337* (2013.01); *H01L 21/02164* (2013.01); *H01L 21/0217* (2013.01); *H01L 21/0332* (2013.01); *H01L 21/31116* (2013.01); *H01L 21/31144* (2013.01); *H01L 21/76802* (2013.01); *H01L 21/76877* (2013.01)

(58) Field of Classification Search
None
See application file for complete search history.

(56) References Cited

U.S. PATENT DOCUMENTS

| 2015/0294978 | A1* | 10/2015 | Lu | H10B 41/20 |
| | | | | 438/269 |
| 2015/0357398 | A1 | 12/2015 | Crook et al. | |
| 2018/0076032 | A1* | 3/2018 | Wang | H01L 21/0337 |
| 2020/0126791 | A1* | 4/2020 | Rizzolo | H01L 21/0337 |
| 2020/0370172 | A1* | 11/2020 | Moriya | C23C 28/40 |
| 2022/0102289 | A1 | 3/2022 | Kim et al. | |

OTHER PUBLICATIONS

International Search Report and Written Opinion on International Application No. PCT/US2024/039105 dated Nov. 7, 2024 (11 Pages).

* cited by examiner

Primary Examiner — Stephanie P Duclair
(74) Attorney, Agent, or Firm — Foley & Lardner LLP

(57) ABSTRACT

A method for fabricating semiconductor devices is disclosed. The method includes forming a stack over a substrate. The method includes forming a hardmask layer over the stack, the hardmask layer comprising a first tungsten containing sub-layer, and at least one compressive sub-layer and at least one tensile sub-layer. The method includes forming a patternable layer over the hardmask layer. The method includes etching the hardmask layer according to the patternable layer.

18 Claims, 13 Drawing Sheets

100

202/
306

110

104

102

500

502
Form Dielectric Layer

504
Form Compressive Sub-Layer

506
Form Tensile Sub-Layer

508
Etch hardmask

510
Etch dielectric

512
Remove Hardmask Layer

HARDMASK INTEGRATION FOR HIGH ASPECT RATIO APPLICATIONS

TECHNICAL FIELD

This disclosure relates to semiconductor devices. The semiconductor devices can include high aspect ratio etches which may be etched by an etchant selective to other features of the semiconductor device relative to a protective layer such as a hardmask.

BACKGROUND

Fabrication of semiconductor devices relies on execution of various fabrication processes that are performed repeatedly in order to form desired semiconductor features on a substrate. In the recent years, scaling down semiconductor devices became more challenging as features sizes reached single digit nanometer range.

SUMMARY

In order to continue scaling down semiconductor devices, device structures can be designed to extend in their vertical direction, such as upwards from the substrate on which they are fabricated. Such designs can employ various stacked layers. For example, tens, hundreds, or thousands of oxide-nitride-oxide layers can be stacked for form various logical or memory devices (e.g., flash memory). High aspect ratio (HAR) etches can extend through the various layers of to form connections to or therebetween. The etchants can be substantially anisotropic such that the distance between etched portions can be small, which can increase device density, and thus lower resistive losses, improve yields, and so forth.

The incorporation of stressed hardmasks such as those including metal films such as tungsten-containing films over the layers can provide improved selectivity relative to other hardmasks including amorphous carbon hardmasks. Hardmasks of a reduced thickness can be employed according to the improved selectability. However, the use of reduced thickness hardmasks can allow etchants to laterally etch sidewalls of the layers under the hardmask. Moreover, increasing a thickness of the hardmasks can increase wafer stress, whereas hardmasks comprising a stressed (e.g., compressive) material can cause a wafer to bow which can lead to wafer breakage, difficulty in wafer handling or processing, or the like. Thus, a deposition of an oppositely stressed (e.g., tensile) material such as a nitride between alternating compressive hardmask layers can increase a thickness of the hardmask to avoid bowing and protect the sidewalls of various layers from etchants.

One aspect of the present disclosure is directed to a method for fabricating semiconductor devices. The method includes forming a stack over a substrate. The method includes forming a patternable layer over the hardmask layer. The method includes forming a hardmask layer over the stack, the hardmask layer comprising a first tungsten containing sub-layer, the hardmask layer including at least one compressive sub-layer and at least one tensile sub-layer. The method includes forming a patternable layer over the hardmask layer. The method includes etching the hardmask layer according to the patternable layer.

The method may further include, to form the hardmask layer, forming the first tungsten containing sub-layer over the stack. The method may further include, to form the hardmask layer, forming a nitride sub-layer over the first tungsten containing sub-layer. The method may further include, to form the hardmask layer, forming a second tungsten containing sub-layer over the nitride sub-layer, wherein the tungsten containing sub-layers are stressed opposite from the nitride sub-layer.

The tungsten containing sub-layers can include stressed elemental tungsten, tungsten silicide, tungsten nitride, or tungsten silicon nitride. The nitride sub-layer can comprise stressed silicon nitride.

The stack can include one or more oxide layers including silicon dioxide. The method can further include etching the stack based on the patterned hardmask layer.

The oxide layers can include silicon dioxide. The nitride layers can include silicon nitride.

The stack can include alternating oxide layers and nitride layers, Tetraethyl orthosilicate (TEOS), or polysilicon.

The aspect ratio of the etching process can exceed ten.

The stack can include at least 20 alternating oxide layers and nitride layers. A total thickness thereof can exceed 8 μm. A hardmask layer thickness can exceed 0.5 μm.

The selective etching can extend from an upper surface of the hardmask layer to the substrate.

The method may further include, to selectively etching the stack, forming a first sidewall and a second sidewall opposite the first sidewall. A distance between the first sidewall and the second sidewall can monotonically decrease between an upper surface of the stack and the substrate of the semiconductor device.

Another aspect of the present disclosure is directed to a method for fabricating semiconductor devices. The method can include forming a first tungsten-based layer over an upper surface of a semiconductor device stressed in a first mode. The method can include forming a nitride layer stressed in a second mode opposite the first mode. The method can include forming a second tungsten-based layer over the upper surface of a semiconductor device stressed in the first mode. The method can include forming a patternable layer over the second tungsten-based layer. The method can include etching the semiconductor device to form an opening through each of the first tungsten-based layer, the nitride layer, and the second tungsten-based layer. The method can include removing the first tungsten-based layer, the nitride layer, and the second tungsten-based layer.

The first tungsten-based layer can be formed over a plurality of dielectric layers of a stack. The etching can extend through the plurality of dielectric layers of a stack to a substrate. The method can include forming a reentrant cavity extending no lower than the first tungsten-based layer.

The method can include forming conductive elements in the openings. The method can include connecting the plurality of dielectric layers of a stack of layers to form a memory device. The memory device can be a NAND flash memory device. The memory device can be a DRAM memory device.

The tungsten-based layers can include at least one of elemental tungsten, tungsten silicide, tungsten nitride, tungsten carbide, or tungsten silicon nitride. The nitride layer can include silicon nitride.

Another aspect of the present disclosure is directed to a method for fabricating a memory device. The method includes (a) forming a stack over a substrate. The method includes (b) forming a compressive layer over the stack. The method includes (c) forming a tensile layer over the substrate. The method includes alternating between each of (b) and (c) such that a total compressive stress exceeds a first stress constraint for the substrate, a total tensile stress exceeds a second stress constraint for the substrate, and a net stress does not exceed the first stress constraint or the second stress constraint. The method includes etching the memory device from an upper surface to the stack.

The stack can include alternating oxide layers and nitride layers; the nitride layers can include a same material as the tensile layer.

The compressive layer can include elemental tungsten, tungsten silicide, tungsten nitride, tungsten carbide, or tungsten silicon nitride. The tensile layer can include silicon nitride.

Etching the memory device can include extending the opening though the alternating oxide layers and nitride layers, and forming a reentrant cavity disposed vertically above the stack.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Indeed, various features of the figures may be intentionally emphasized to depict various features thereof. Unless indicated as representing the background art, the figures represent aspects of the disclosure. For purposes of clarity, not every component may be labeled in every drawing. In the drawings.

DETAILED DESCRIPTION

Figure 1A:
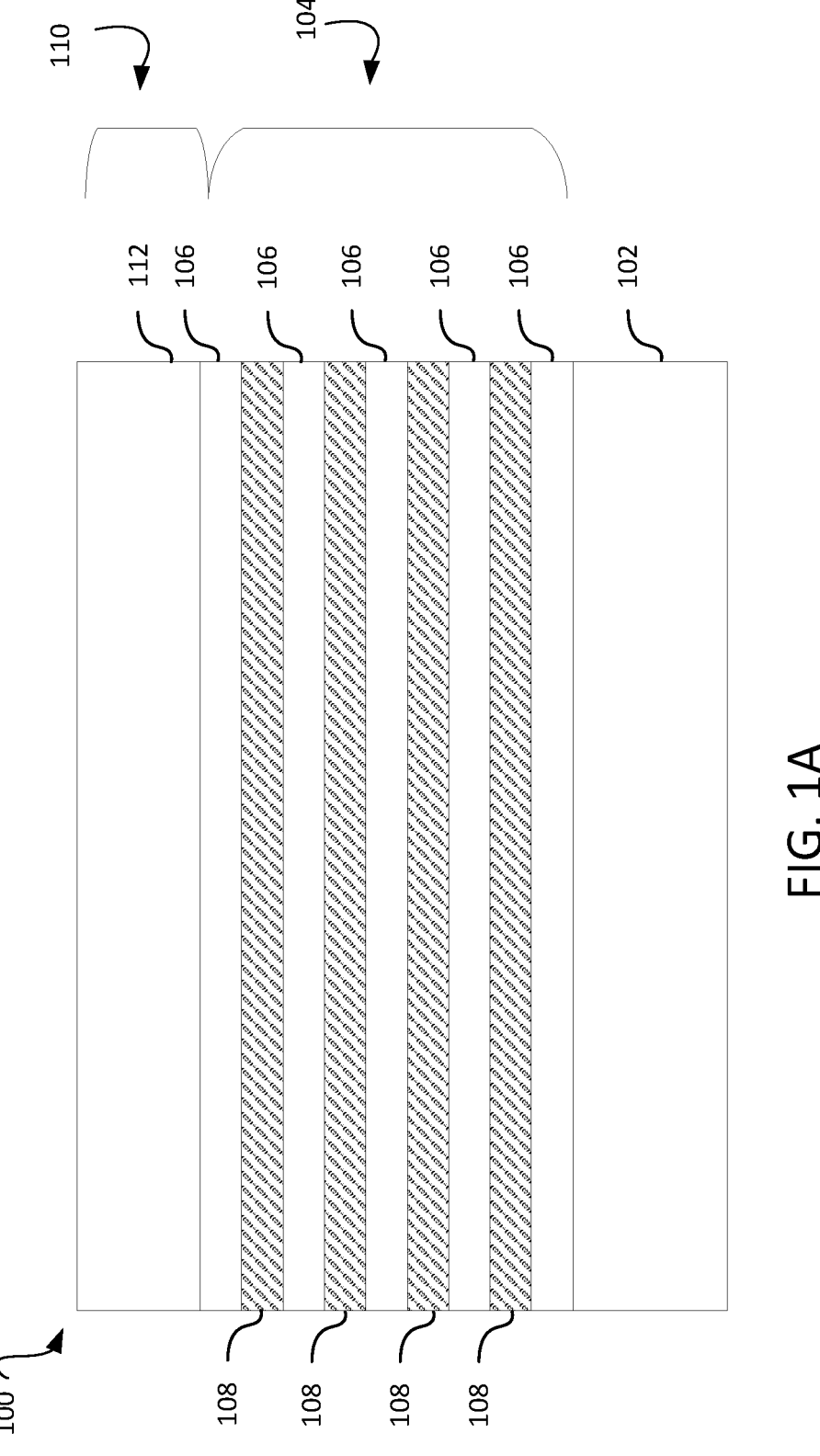
FIG. 1A illustrates a semiconductor device including a stressed hardmask layer, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Likewise, although the Figures and aspects of the disclosure may show or describe devices herein as having a particular shape, it should be understood that such shapes are merely illustrative and should not be considered limiting to the scope of the techniques described herein. For example, although certain figures show various layers defining transistor structures or other electric structures in a circular configuration, other shapes are also contemplated, and indeed the techniques described herein may be implemented in any shape or geometry.

In general, FIGS. 1A, 1B, and 2-4 depict semiconductor features during processing operations thereof. The depictions of the semiconductor features may aid in understanding the method of FIG. 5, and associated FIGS. 6-12. For example, some features of 1A, 1B, and 2-4 may be absent, modified, or otherwise differently depicted between FIGS. 1A, 1B, and 2-4 and FIGS. 6-12.

Referring now to FIG. 1A, an example semiconductor device 100 including a stressed (e.g., compressively stressed) hardmask layer 110 is provided. The semiconductor device 100 includes a substrate 102 such as a semiconductor (e.g., silicon) substrate 102. A stack of dielectric layers 104 (hereinafter "stack 104") is disposed over the substrate 102. The stack 104 can include a plurality of layers. For example in FIG. 1A, the layers can include oxide layers 106 and nitride layers 108 alternatingly arranged on top of one another. Various additional layers such as etch stop layers, redistribution layers, or the like may be included between or over the oxide layers 106 and the nitride layers 108, or over the substrate 102. The oxide layers 106 and nitride layers 108, along with various layers disposed therebetween, or the like, can be referred to collectively as a stack 104.

Constituent layers of the stack 104 or other layers may be referred to as sub-layers. Such a nomenclature merely refers to a combination of one or more layers for ease of reference and does not imply any attribute or feature. For example, any of the various layers described herein may be referred to as a sublayer of the semiconductor device 100.

As depicted, a hardmask layer 110 includes one or more compressive sub-layers 112 of a hardmask material including tungsten (e.g., a tungsten sub-layer). As is further discussed with regard to FIG. 8, the tungsten-based sublayer or other layers can be under compressive or tensile stress. Such stress can cause a flexing or bowing of the substrate 102 (e.g., a semiconductor wafer), which can lead to handling faults of semiconductor wafers, processes affecting the wafers, or affect a function of the semiconductor device 100.

Figure 1B:
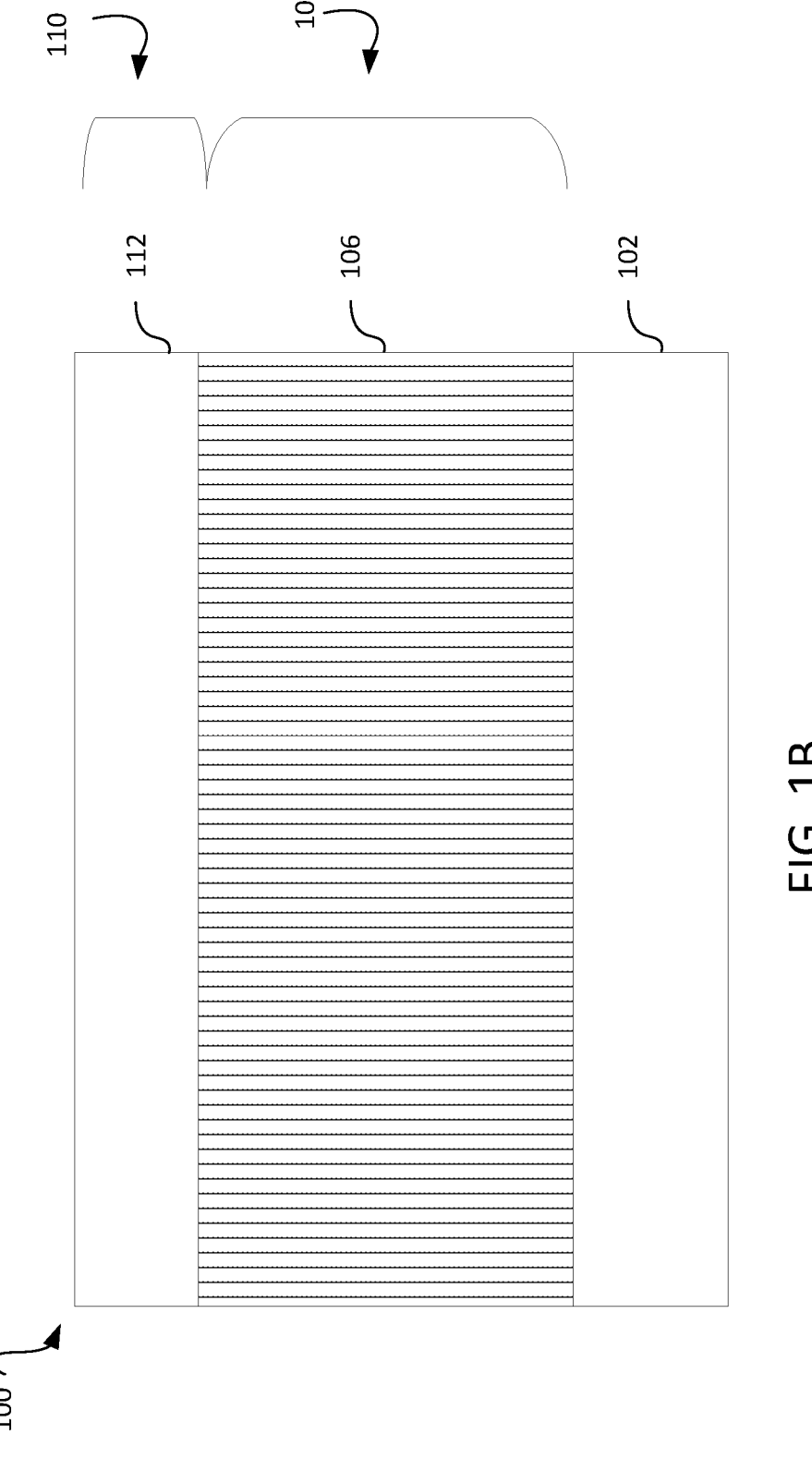
FIG. 1B illustrates a semiconductor device including a stressed hardmask layer, in accordance with some embodiments.

Referring now to FIG. 1B, another example semiconductor device 100 including a stressed (e.g., compressively stressed) hardmask layer 110 is provided. The stack 104 of the semiconductor device 100 can be or include an oxide layer 106, such as a thick oxide layer 106 employed for a multi-layer contact memory. The oxide layer 106 can exceed a thickness of the oxide layer 106 of FIG. 1A. For example, the oxide layer 106 can exceed a thickness of about 8 μm. That is, the stack 104 can include a single oxide sub-layer. The stack 104 can be formed over a substrate 102, as described with regard to FIG. 1A. A hardmask 110 including one or more compressive sub-layers can be formed over the stack 104, as is described with regard to the oxide-nitride-oxide stack 104 of FIG. 1A. Merely for brevity, various figures and descriptive text hereinafter refers to stack 104 of FIG. 1A rather than the stack 104 of FIG. 1B (e.g., to include alternating oxide-nitride-oxide layers). Such depictions, like other figures provided herein, are non-limiting illustrative examples. Various embodiments can be substituted between the stack 104 of FIG. 1A and the stack 104 of FIG. 1B.

Figure 2:
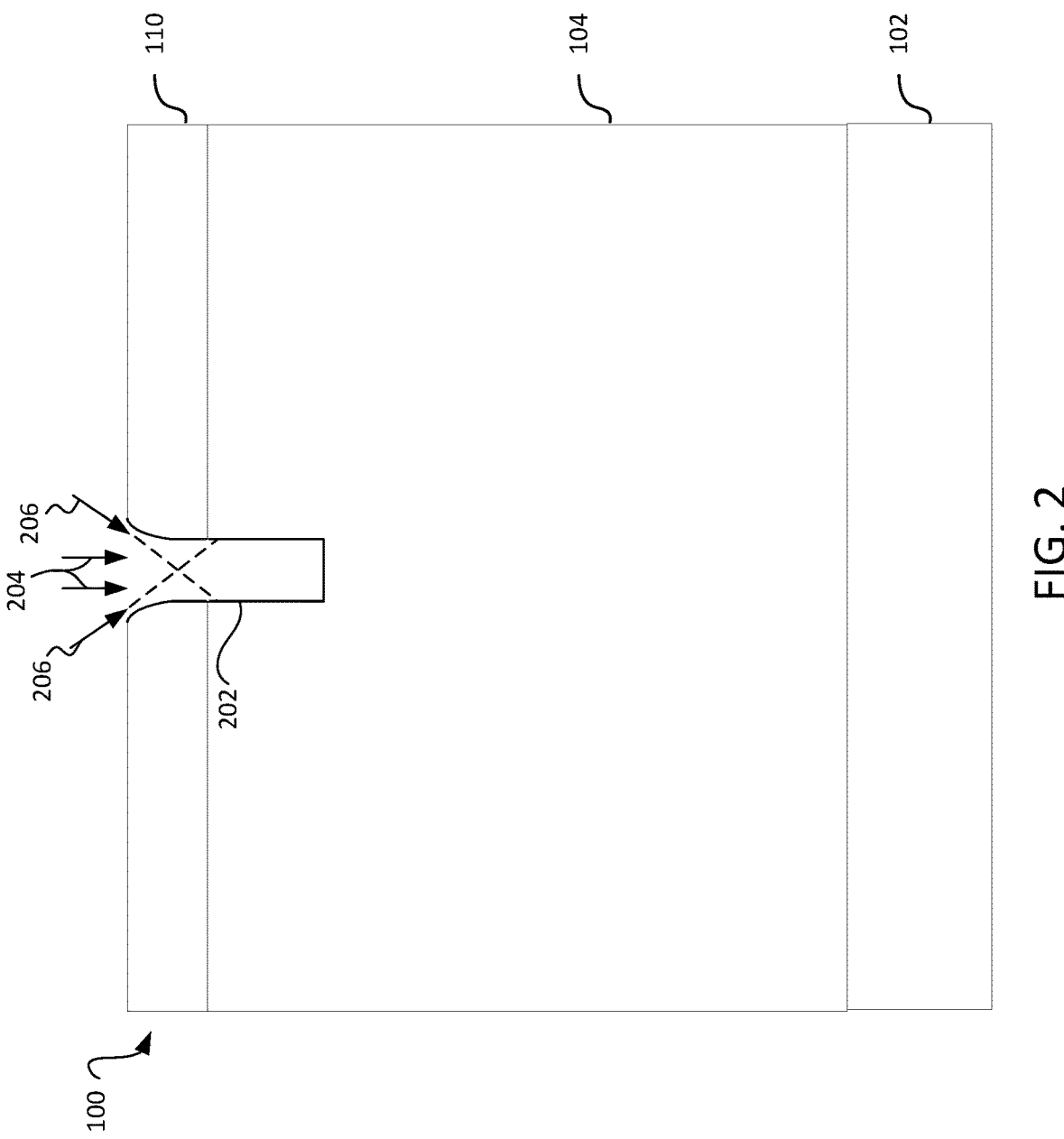
FIG. 2 illustrates a semiconductor device undergoing a high aspect ratio etch, in accordance with some embodiments.

FIG. 2 illustrates an example of a semiconductor device 100 undergoing a high aspect ratio etch. For example, the semiconductor device 100 can be the semiconductor device 100 of FIG. 1A or a variant thereof. Various layers or other components of the semiconductor device 100 may be omitted, such as patterning layers, which are further discussed with regard to FIG. 10. An opening 202 (e.g., slit etch, channel etch, or the like) is formed through the hard mask layer 110 and the stack 104. The opening 202 can be formed from various anisotropic etching techniques, such as deep reactive ion etching. A substantial portion of the etching can be substantially perpendicular to a surface of the semiconductor device 100. However, a portion of the etching can be strike the hardmask at oblique angles which may cause non-vertical sidewalls, such as based a depicted shoulder along an upper surface thereof, as depicted. For example, first etchant 204 (e.g., ions) can impact the upper surface of the semiconductor device 100 perpendicular thereto. Second etchant 206 (e.g., the same etchant at another angle) can impact the semiconductor device 100 at a non-perpendicular angle, which can cause an upper surface of the opening 202 to relative to a lower portion of the depicted opening 202. Lower in the opening 202, the depth of the opening 202 can block etchants at oblique angles such that the lower portion of the opening 202 is relatively vertical, early in the etching process. Later in the etching process, the second etchant 206 can deflect from the non-vertical portion of the sidewall of the opening 202 and strike a lower portion of the opening.

Figure 3:
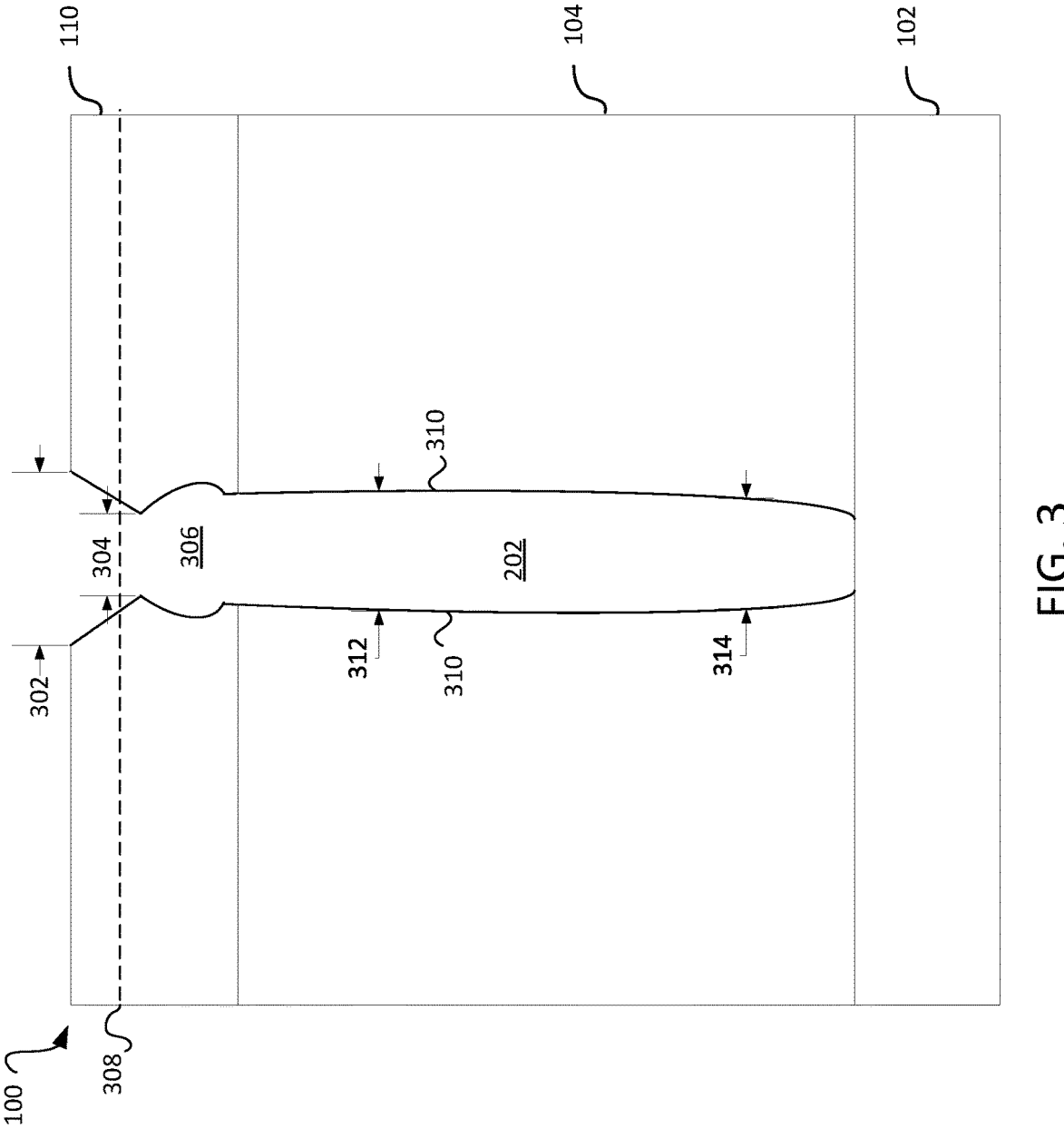
FIG. 3 illustrates a semiconductor device undergoing a high aspect ratio etch, in accordance with some embodiments.

FIG. 3 illustrates an example of a semiconductor device 100 undergoing a high aspect ratio (HAR) etch. The semiconductor device 100 can be the semiconductor device 100 of FIG. 1A and FIG. 2 or a variant thereof (e.g., FIG. 1B). For example, the etch of FIG. 2 or a subsequent etch can extend through the substrate 102. As depicted in FIG. 2, an upper surface 302 of the opening 202 can be of greater dimension than another portion of the opening 202. A local minimum 304 of the opening 202 can be of lesser lateral dimension than the upper surface 302. For example, the local minimum can correspond to the bottom of the shoulder depicted in FIG. 2. The local minimum 304 can define an upper portion of a reentrant cavity 306, formed by etchants entering the opening 202 at non-perpendicular angle, or interfacing with the hardmask layer 110 before deflecting further downward (e.g., the deflected ions of FIG. 2). According to various embodiments, at least a portion of the reentrant cavity 306 can be within the hardmask layer 110 or the stack 104. For example, an embodiment can include a reduced hardmask thickness (e.g., extending from the depicted upper surface of the semiconductor device 100 to a lateral plane 308 through or above the reentrant cavity 306). In such an embodiment, the reentrant cavity 306 can extend into the stack 104 which can affect a function thereof.

Containing the reentrant cavity 306 within the hardmask layer 110 may decrease a spacing between openings 202, to increase device density (e.g., because the hardmask layer 110 may be removed in a subsequent process, such that the reentrant cavity 306 is not included in a complete semiconductor device 100).

The portion of the opening 202 in the stack 104 extends substantially vertically towards the substrate 102. For example, the opening 202 can include opposite sidewalls 310 which can be vertical, or substantially vertical. The distance between the sidewalls 310 can generally or monotonically decrease towards the substrate 102, such that a first opening distance 312 extends across a greater lateral dimension than a second opening distance 314 disposed vertically there-below.

Figures 4A, 4B, 4C:
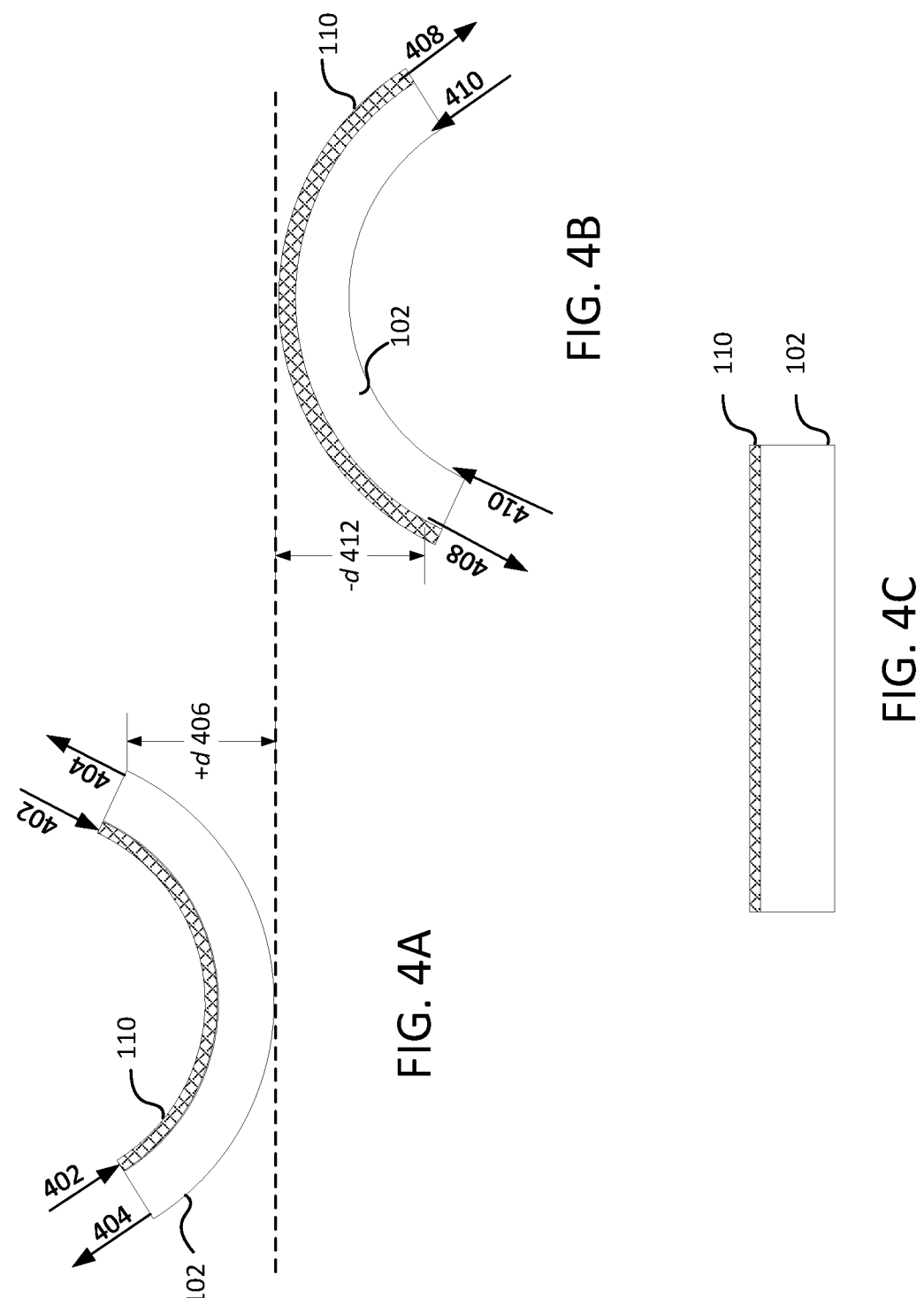
FIGS. 4A, 4B, and 4C illustrate a semiconductor wafer undergoing various stressed position displacement, in accordance with some embodiments.

FIGS. 4A, 4B, and 4C illustrate a semiconductor wafer undergoing various stressed positions, in accordance with some embodiments. Referring to FIG. 4A, the semiconductor wafer (e.g., substrate 102) is depicted as bowed upwards. Such a bowing results from a material or deposition process (e.g., temperature) resulting in a net tensile film material in the hardmask layer 110, wherein the hardmask layer 110 includes one or more alternating tensile and compressive sub-layers. In some embodiments, the tensile film material may be a nitride such as silicon nitride, or TEOS. For example, the hardmask layer 110 can include alternating layers of equal thickness of silicon nitride and a tungsten comprising hardmask, having a net compressive force causing a positive deflection 406 of the substrate 102 (e.g., about 0.3 mm). The tensile force may refer to a tensile force 404 applied to the substrate 102 based on a compressive force 402 of the hardmask layer 110 or other films disposed over an upper surface of the substrate 102 (e.g., the hardmask layer 110 in combination with other film layers).

Referring now to FIG. 4B, the semiconductor wafer is depicted as bowed downwards. Such a bowing may result from a material or deposition process (e.g., temperature) resulting in a net compressive film material in the hardmask layer 110. In some embodiments, the compressive film material may be a tungsten containing material such as elemental tungsten, tungsten silicide, tungsten nitride, tungsten carbide, or tungsten silicon nitride. For example, the hardmask layer 110 can include one or more layers of a tungsten-based hardmask, having a net compressive force causing a negative deflection 412 of the substrate 102. The compressive force may refer to a compressive force 410 applied to the substrate 102 based on a tensile force 408 of the hardmask layer 110 or other films disposed over an upper surface of the substrate 102 (e.g., the hardmask layer 110 in combination with other film layers).

Referring now to FIG. 4C, a non-stressed or reduced stress wafer is depicted. The substrate 102 and hardmask layer 110 lack visible deflection which may aid in retention by various wafer transfer systems, processing operations, or the like. Although the various figures provided herein are nor to scale (e.g., the deflection of FIG. 4A and FIG. 4B may be less than 1 mm for a 300 mm wafer). The hardmask layer 110 includes gross compressive and tensile forces but lacks a net compressive or tensile force applied to the wafer (or include a net compressive or tensile force below a threshold). For example, the hardmask layer 110 can include tungsten containing materials intermediated by tensile nitrides or TEOS. In some embodiments, the hardmask layer 110 includes a same material deposited according to different processes (e.g., different temperatures) such that a chemically similar monolayer includes alternating layers of compressive and tensile layers, such as tungsten silicide, tungsten nitride, or tungsten silicon nitride.

Figure 5:
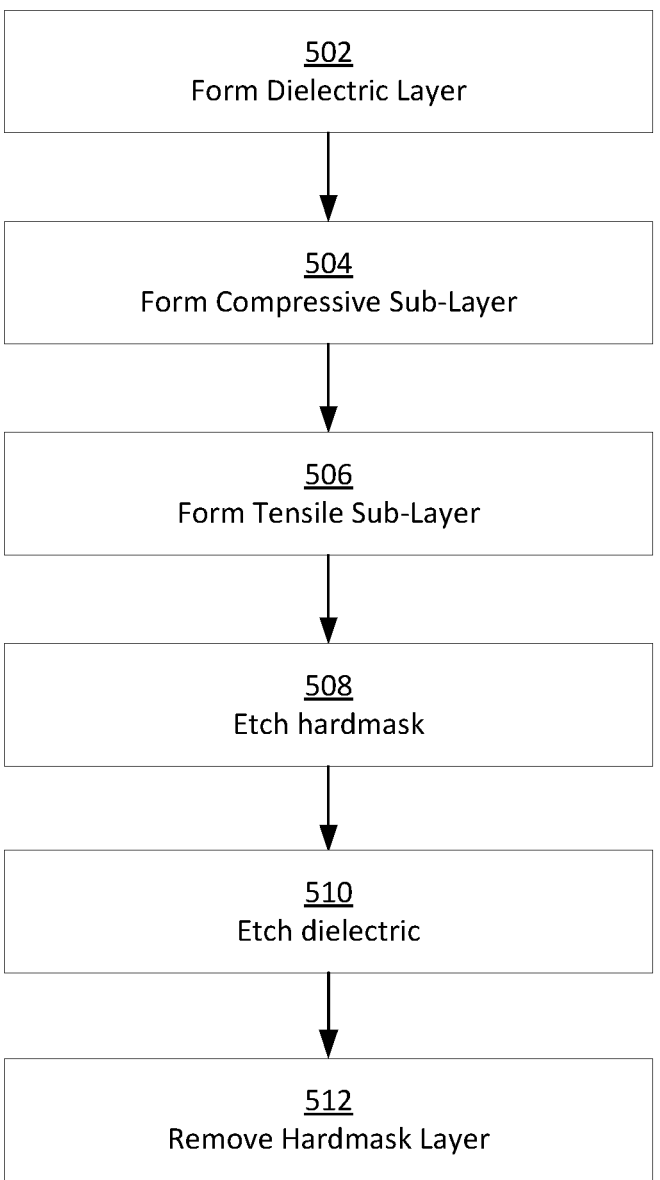
FIG. 5 illustrates a method for forming a semiconductor device, in accordance with some embodiments.

FIG. 5 illustrates a flowchart of an example method 500 for forming a semiconductor device 100. For example, the semiconductor device 100 can include a plurality of memory cells such as a DRAM memory, a NAND flash, NOR flash, or the like. Various memory cells can connect to conductive elements formed in the openings to operate as vertical or horizontal lines (word lines, bit lines, and the like). Vertical lines may be disposed in openings 202 formed herein. Other lines may thereafter be connected to the stacked layers (e.g., oxide-nitride-oxide layers), after patterning the layers to form a stair-step pattern. It is noted that the method 500 is merely an example, and is not intended to limit the present disclosure. Accordingly, it is understood that additional operations may be provided before, during, and after the method 500 of FIG. 5, and that some other operations may only be briefly described herein.

In various embodiments, operations of the method 500 may be associated with cross-sectional views of an example semiconductor device 100 at various fabrication stages as shown in FIGS. 6 to 12, which will be discussed in further detail below. It should be understood that the semiconductor device 100, shown in FIGS. 6 to 12, may include a number of other devices such as inductors, fuses, capacitors, coils, etc., while remaining within the scope of the present disclosure. For example, a wafer can undergo one or more annealing processes which may control a stress stored in a wafer to a deflection thereof.

In brief overview, the method 500 starts with operation 502 of forming a stack 104 over a substrate 102. The method 500 continues to operation 504 of forming a compressive sub-layer 112 of a hardmask layer 110 over the stack 104. The method 500 continues to operation 506 of forming a tensile sub-layer 114 of the hardmask layer 110 over the compressive sub-layer 112. The method 500 continues to operation 508 of etching the hardmask layer 110. The method 500 continues to operation 510 of etching the stack 104. The method 500 continues to operation 512 of removing the hardmask layer 110.

Figure 6:
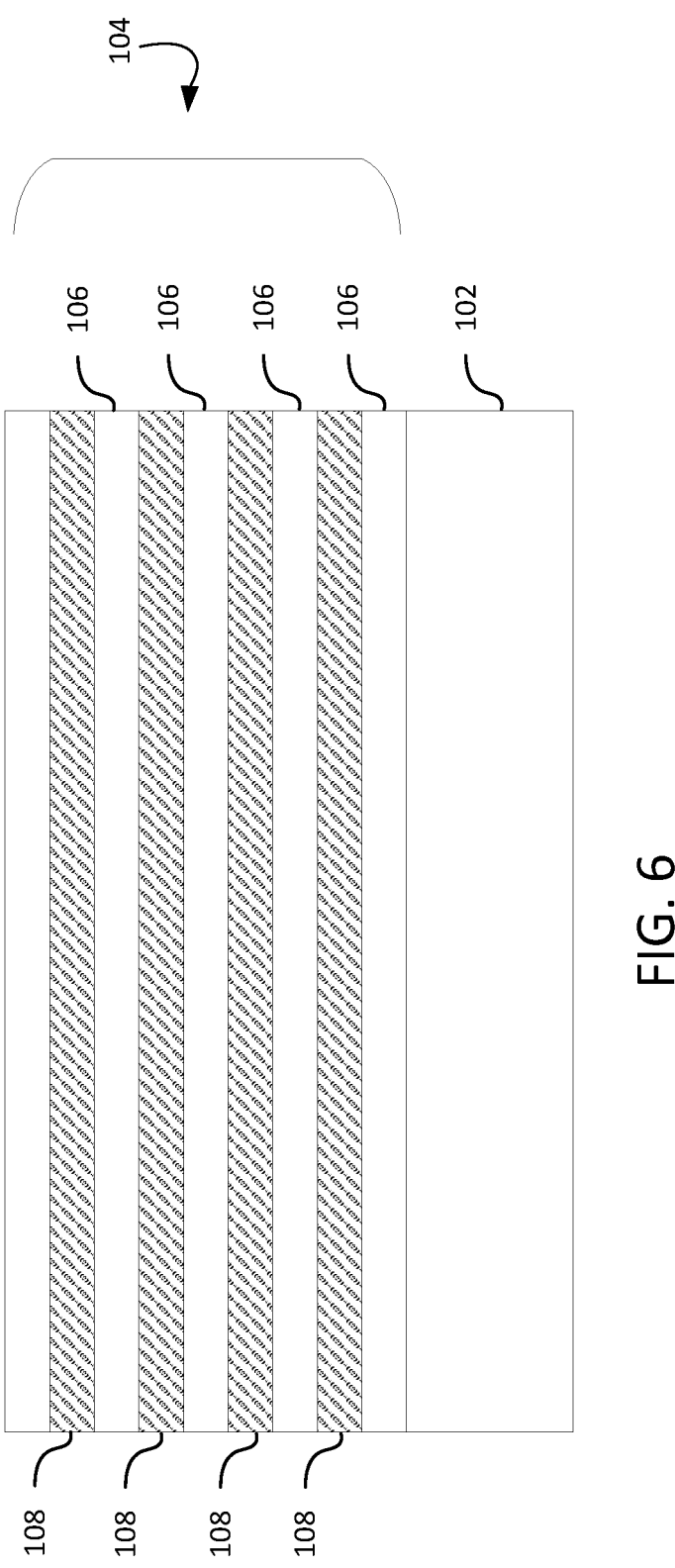
FIGS. 6, 7, 8, 9, 10, 11, and 12 illustrate respective cross-sectional views of a semiconductor device during various fabrication stages of the method of FIG. 5, in accordance with some embodiments.

Corresponding to operation 502 of FIG. 5, FIG. 6 is a cross-sectional view of the semiconductor device 100 in which, over a substrate 102, a stack 104, including a number of alternating oxide layers 106 and nitride layers 108 is formed, in accordance with various embodiments.

The substrate 102 includes a semiconductor material substrate 102, for example, silicon. Alternatively, the substrate 102 may include other elementary semiconductor material such as, for example, germanium. The substrate 102 may also include a compound semiconductor such as silicon carbide, gallium arsenic, indium arsenide, and indium phosphide. The substrate 102 may include an alloy semiconductor such as silicon germanium, silicon germanium carbide, gallium arsenic phosphide, and gallium indium phosphide. In one embodiment, the substrate 102 includes an epitaxial layer. For example, the substrate 102 may have an epitaxial layer overlying a bulk semiconductor. Furthermore, the substrate 102 may include a semiconductor-on-insulator (SOI) structure. For example, the substrate 102 may include a buried oxide (BOX) layer formed by a process such as separation by implanted oxygen (SIMOX) or other suitable technique, such as wafer bonding and grinding.

As shown, a stack 104 is formed over the substrate 102. The stack 104 can include one or more sublayers to form a logic or memory device therefrom. For example, the stack 104 can be a stack of alternating oxide-nitride-oxide layers to form a memory device. The first sub-layer of the stack may be a first oxide layer 106 formed over the substrate 102. The first oxide layer 106 can be formed according to a deposition process, growth process, or the like. For example, the first oxide layer 106 may be formed by a physical vapor deposition (PVD), high density plasma chemical vapor deposition (HDP-CVD), a flowable CVD (FCVD) (e.g., a CVD-based material deposition in a remote plasma system and post curing to make it convert to an oxide), plasma enhanced chemical vapor deposition (PECVD) the like, or combinations thereof. Other materials and/or other formation processes may be used in various embodiments. The oxide can be, for example, a silicon oxide (e.g., silicon dioxide), germanium oxide (e.g., germanium dioxide), etc. Subsequent to the formation of the first oxide layer 106, a first nitride layer 108 is formed there over. For example, the first nitride layer 108 can be formed by a same or different process as the first oxide layer 106. For example, the nitride layer 108 can be formed by a physical vapor deposition (PVD), high density plasma chemical vapor deposition (HDP-CVD), a flowable CVD (FCVD) (e.g., a CVD-based material deposition in a remote plasma system and post curing to make it convert to a nitride), the like, or combinations thereof. The first nitride can be, for example, a silicon nitride (e.g., $Si_3N_4$), germanium nitride (e.g., $Ge_3N_4$), etc.

With continued reference to operation 502, the stack 104 can continue to build up by alternating the oxide layer 106 and nitride layers 108. For example, each oxide layer 106 or nitride layer 108 can have a thickness of (substantially) less than 1 μm, wherein the stack 104 can reach a thickness of greater than 5 μm, such as about 10 μm or greater than 10 μm. The number of layers of the stack 104 can be proportional to a number of bits of a memory device, thus increasing a number of layers may be desirable in some embodiments. The stack 104 can include any number of oxide layers 106 and nitride layers 108. For example, in some embodiments, stack 104 can include at least 20 alternating oxide layers 106 and nitride layers 108, such as greater than 40 or greater than 60 layers.

Figure 7:
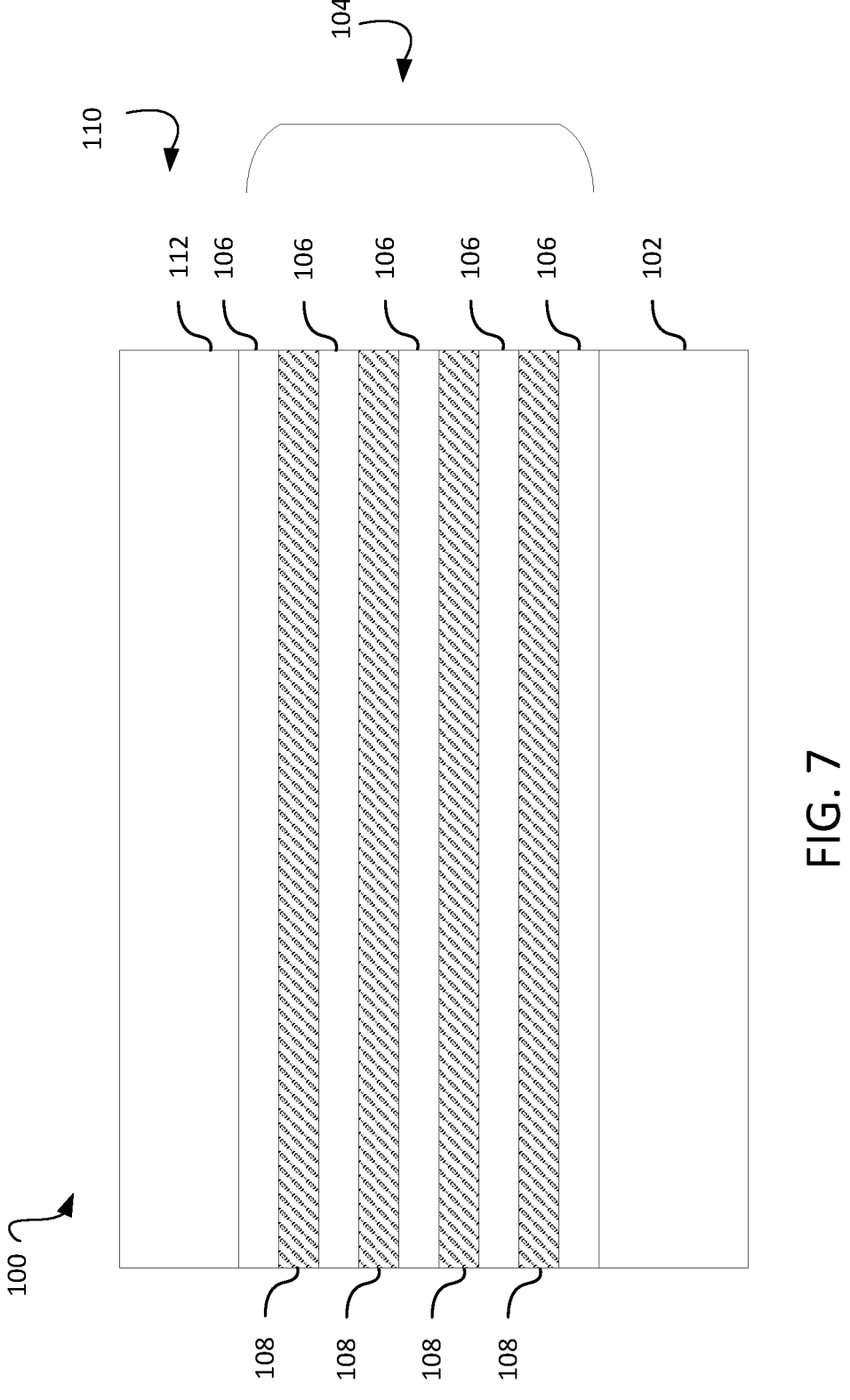

Corresponding to operation 504 of FIG. 5, FIG. 7 is a cross-sectional view of the semiconductor device 100 in which, over the stack 104, a hardmask layer 110 comprising a compressive sub-layer 112 is formed, in accordance with various embodiments.

As shown, a hardmask layer 110 is formed over the substrate 102. The hardmask layer 110 can include a tungsten based material (e.g., elemental tungsten, tungsten silicide, tungsten nitride, tungsten carbide, or tungsten silicon nitride). For example, the tungsten based material may be a tungsten silicide having approximately 60% tungsten content (e.g., between about 30% and about 80%). In the depicted embodiment, the compressive sub-layer 112 of the hardmask layer 110 is applied by a physical vapor deposition process at an ambient temperature (e.g., less than 100° C., such as about 20° C.). Such a deposition is not intended to be limiting. For example, the compressive sub-layer 112 may be formed by a physical vapor deposition (PVD), high density plasma chemical vapor deposition (HDP-CVD), a flowable CVD (FCVD), PECVD and so forth. The process temperature, pressure, or other properties thereof can be varied to adjust a stress of the hardmask or the wafer generally.

Figure 8:
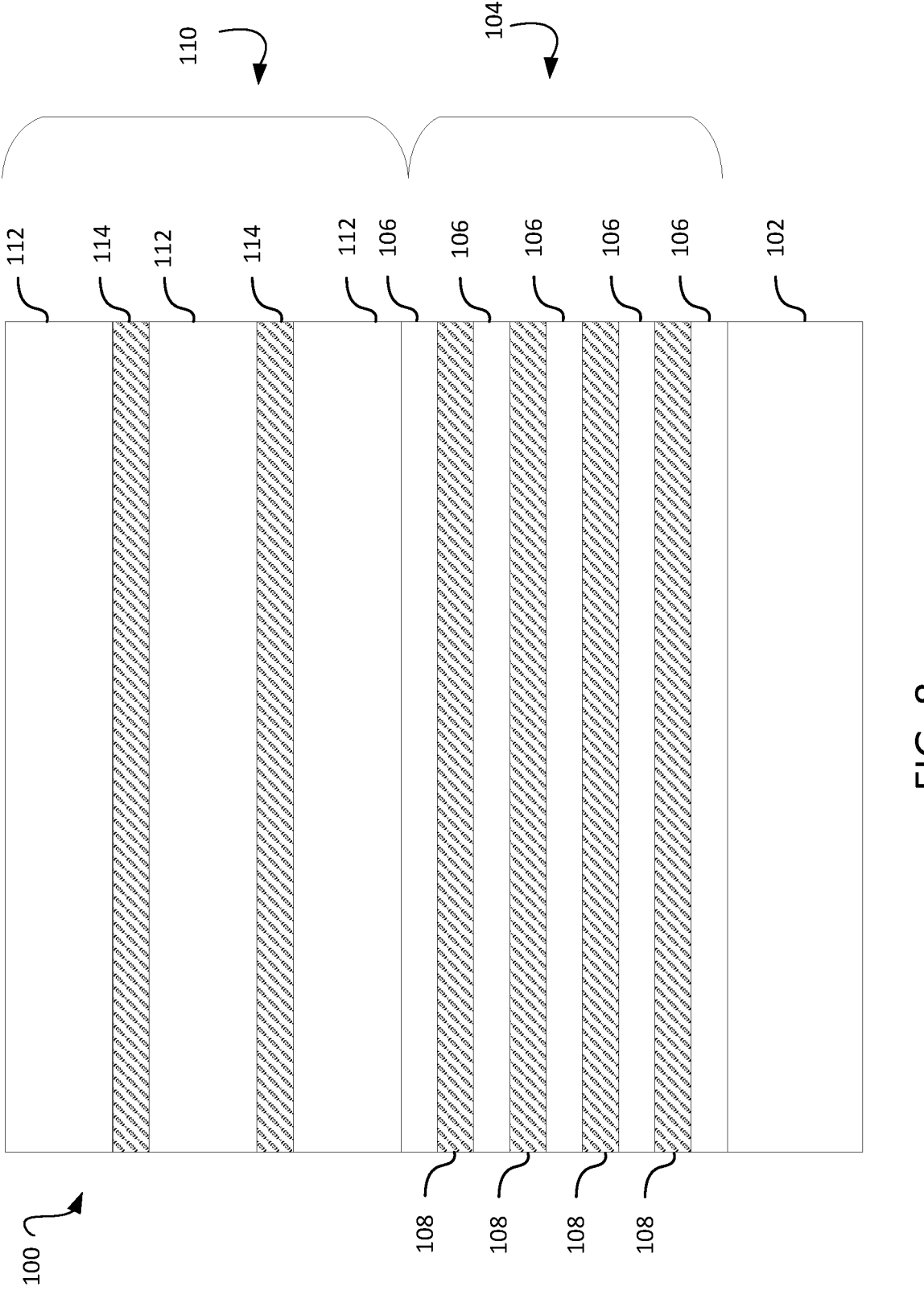

Corresponding to operation 506 of FIG. 5, FIG. 8 is a cross-sectional view of the semiconductor device 100 in which, over the compressive sub-layer 112, a tensile sub-layer 114 is formed, in accordance with various embodiments.

The tensile sub-layer 114 can be formed from a nitride such as silicon nitride. For example, the tensile sub-layer 114 can include a same material employed in the stack 104, which can reduce a number of process steps or chambers in a production facility. The tensile sub-layer 114 can be of lesser dimension than the compressive sub-layer 112, such that a majority of the thickness of the hardmask layer 110 can be a tungsten based compressive sub-layer 112 and a minority of the thickness can be the tensile sub-layer 114.

In various embodiments, the hardmask layer 110 can be applied at different temperatures or different processes. In some embodiments, the first portion of the hardmask layer 110 can include one or more tensile materials such as a tungsten-based material (e.g., tungsten silicide, tungsten nitride, or tungsten silicon nitride) applied at an elevated temperature. For example, the tungsten silicide, tungsten nitride, or tungsten silicon nitride can be applied at an elevated temperature such that the first hardmask layer 110 is a (tungsten based) tensile sub-layer 114. Put differently, operation 506 can be performed prior to operation 504 wherein the tensile sub-layer 114 is tungsten based. A subsequent sub-layer of the hardmask layer 110 can include a compressive sub-layer 112 such as a nitride based layer applied at a different temperature or process as the nitride in the tensile sub-layer 114 described at operation 504, or a same or different tungsten based material applied by a different process or at a different temperature. Put differently, each of the compressive sub-layer 112 and the tensile sub-layer 114 can be a tungsten based material. Such embodiments may reduce a total hardmask thickness, wherein the tungsten-based tensile material may be more resistive to an etchant for the stack 104 relative to another tensile material (e.g., silicon nitride). However, the thickness of the hardmask layer 110 may be greater than an expected etched portion of the hardmask (e.g., to prevent the formation of reentrant chambers in the stack 104).

Figure 9:
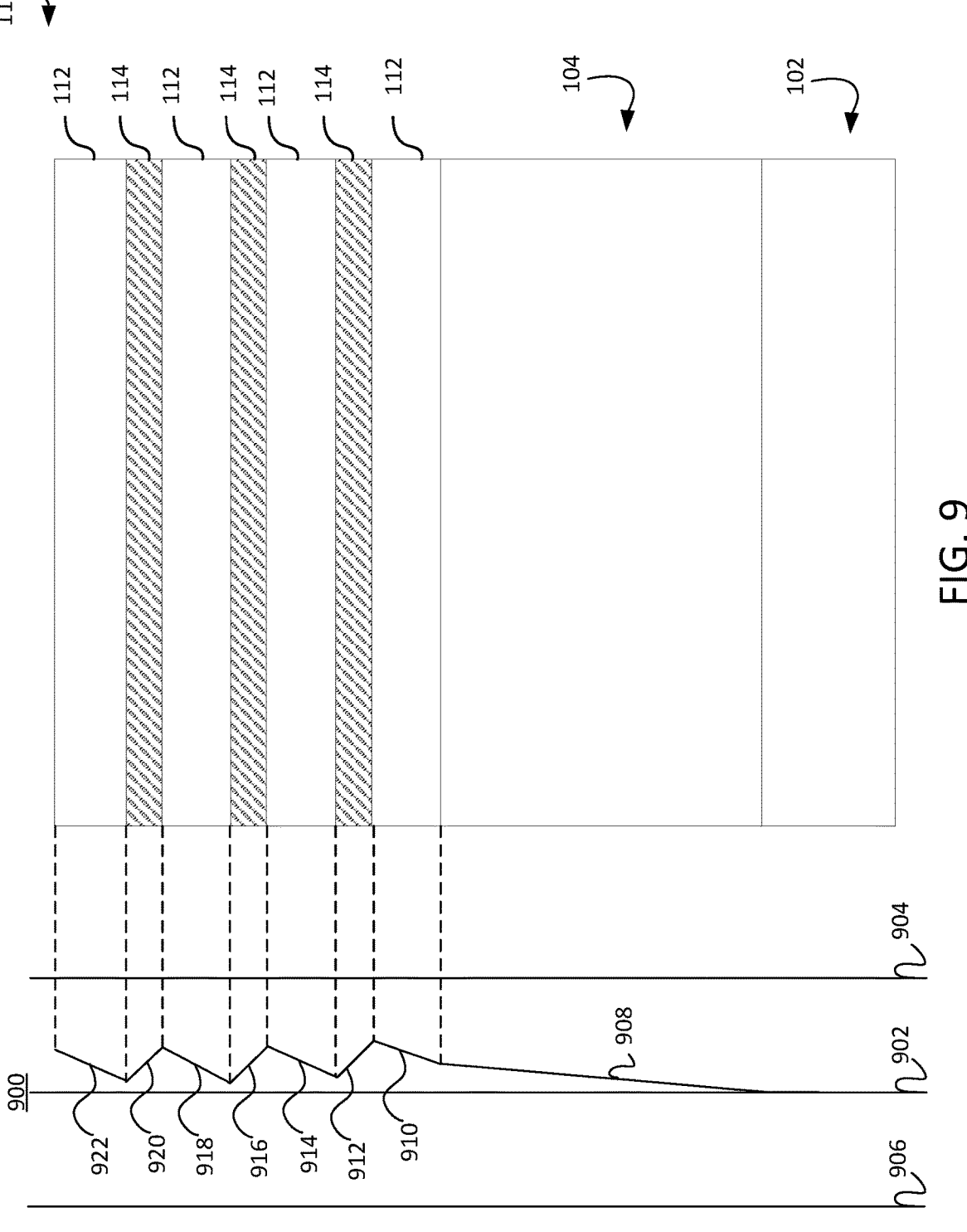

With continued reference to operation 506 of FIG. 5, FIG. 9 is a cross-sectional view of the semiconductor device 100 in which, over the compressive sub-layer 112, a tensile sub-layer 114 is formed, along with a stress diagram 900 thereof, in accordance with various embodiments.

The stress diagram 900 depicts a net stress of the wafer based on the various layers thereof. For example, the stress diagram depicts a non-stressed center-point 902 disposed between an upper threshold 904 and a lower threshold 906. The upper threshold 904 and a lower threshold 906 can correspond to tension or compression limit such as a force or wafer deflection. In some embodiments, the non-stressed point may not be centered between the thresholds (e.g., thresholds may be asymmetric). The substrate 102 (e.g., an intrinsic silicon substrate 102) may have or be normalized to a zero stress level, or include a non-zero value. A first portion 908 of the stress diagram 900 depicts a net accumulation of stress in the stack 104, such as according to each oxide layer 106 and nitride layer 108. A second portion 910 of the stress diagram 900 depicts an increase in stress corresponding to the forming of the compressive sub-layer 112 at operation 506. A third portion 912 of the stress diagram 900 corresponds to a tensile sub-layer 114 formed over the first compressive sub-layer 112. As depicted, the tensile sub-layer 114 can be of lesser thickness than the compressive sub-layer 112, but can include a similar magnitude of stress, such that a tensile sub-layer 114 and compressive sub-layer 112 pair can contribute little or no net stress to the semiconductor device 100. Such a depiction is not limiting. For example, then tensile sub-layer 114 and compressive sub-layer 112 can have different magnitudes of stress, according to a temperature, process and thickness of deposition, such that an uneven number of sublayers can contribute no net stress, to counter a stress of the stack 104, or counter stress of further layers deposited over the hardmask layer 110 in subsequent steps not depicted herein.

Continuing upwardly along the stress diagram 900 to reflect the net wafer stress of a sequence of various operations associated with manufacturing the semiconductor device 100, a fourth portion 914 of the stress diagram 900 depicts a further compressive sub-layer 112 which may be a same or different thickness, relative to the first compressive sub-layer 112. A fifth portion 916 of the stress diagram 900 depicts a further tensile sub-layer 114 which, like the aforementioned compressive sub-layer 112, may vary in dimension relative to the first tensile sub-layer 114. The sixth portion 918 and the eighth portion 922 of the stress diagram 900 depict further compressive sub-layers 112 still, as intermediated by the seventh portion 920 of the stress diagram 900, another tensile sub-layer 114. According to various embodiments, additional or fewer layers may be employed. The layers can be formed based on a manufacturing process such that ion deflection can be contained within the hardmask layer 110 to prevent a formation of a reentrant cavity 306 in the stack 104. For example, each depicted compressive sub-layer 112 can be about 300 nm thick, and each depicted tensile sub-layer 114 can be about 100 nm thick.

As depicted, a total compressive or tensile stress can exceed an upper threshold 904 or a lower threshold 906. For example, the combination of the stress contribution of the tensile sub-layers 114 may, in gross, exceed a threshold 904, 906, such that an omission of the compressive sub-layers 112 can cause the wafer to exceed a stress threshold. Likewise, the combination of the stress contribution of the compressive sub-layers 112 may, in gross, exceed a threshold 904, 906, such that an omission of the tensile sub-layers 114 can cause the wafer to exceed a stress threshold. The combination of the compressive sub-layers 112 and tensile sub-layers 114, however, may not exceed a threshold 904, 906.

Figure 10:
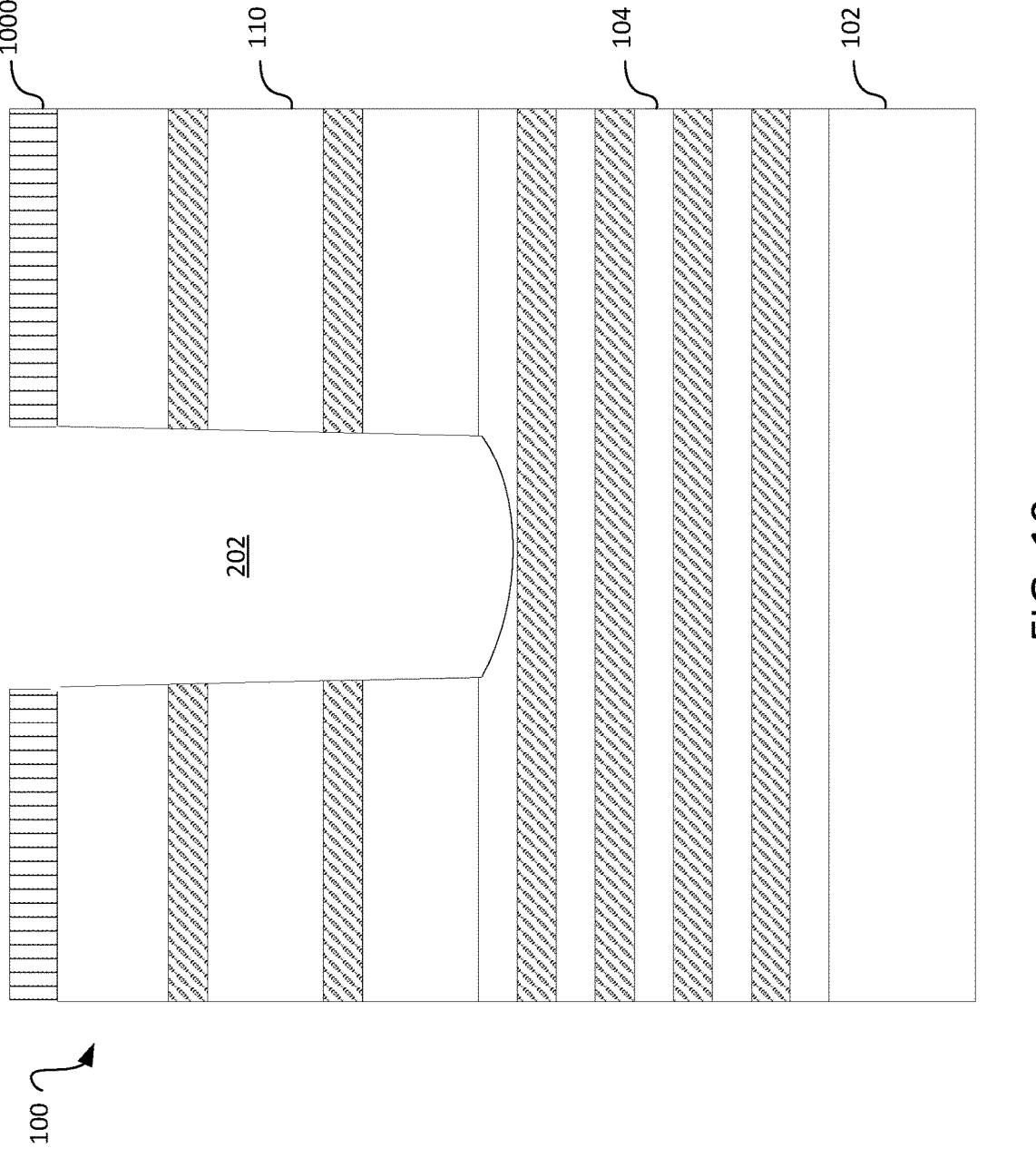

Corresponding to operation 508 of FIG. 5, FIG. 10 is a cross-sectional view of the semiconductor device 100 in which, openings 202 are formed, in accordance with various embodiments.

A patternable layer 1000 (e.g., a positive or negative photoresist mask) with patterns is formed over the hardmask layer 110. The pattern may include a periodic pattern such that periodic openings 202 are formed across the semiconductor device 100, wherein the patterns can be employed to form connections between various cells of a memory device. Next, at least one dry etching or a wet etching process (e.g., including dilute hydrofluoric (DHF) acid), may be performed to etch the hardmask until the stack 104 is exposed so as to form the openings 202. For example, the etch may be selective to the hardmask material relative to the dielectric material, or may be timed, cycled, or otherwise controlled to etch to approximately at a junction between the hardmask layer 110 and the stack 104 (e.g., slightly beyond, as depicted). The etching process may be substantially anisotropic. However, a sidewall of the opening 202 may be non-vertical along one or more portions thereof, such as based on an inward tapering of the sidewall extending downward (as depicted in the present figure), or a rounded upper surface of the hardmask layer 110, as depicted in the opening 202 of FIG. 2, such that ion deflection can cause a reentrant cavity 306 as depicted in FIG. 3 and hereinafter, at FIG. 11.

Following the hardmask etch, the patternable layer 1000 can be removed, such that the semiconductor device 100 includes, as viewed from above, a regularly spaced series of stack 104 portions visible through the openings 202 as intermediated by the remaining portions of the hardmask layer 110.

Figure 11:
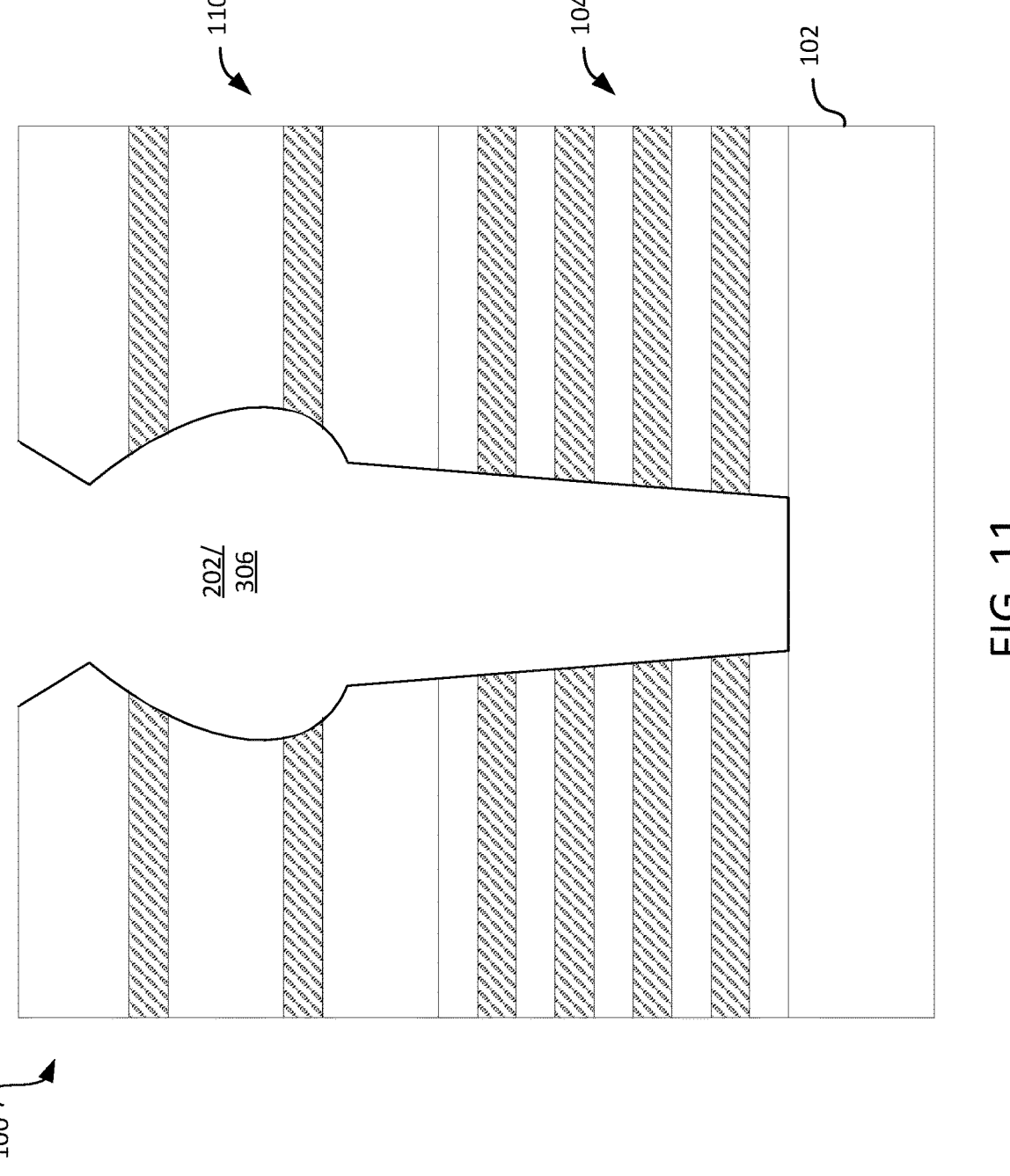

Corresponding to operation 510 of FIG. 5, FIG. 11 is a cross-sectional view of the semiconductor device 100 in which openings 202 are extended through the stack 104, in accordance with various embodiments.

A further etchant (e.g., a plasma etchant) is applied to the surface of the semiconductor device 100 to extend the openings 202 through the stack 104. The remaining hardmask layer 110 may function as a patterned layer to selectively etch the dielectric. The etchant may be at least somewhat selective to etch the stack 104 in favor of hardmask layer 110. However, some etchant may remove at least a portion of the hardmask layer 110 such as an upper most layer thereof. The etching can extend the openings 202 to an etch stop layer formed over the substrate 102, the substrate 102, or the like. In some embodiments, the etchant may be a dry (plasma) etch, wherein a portion of ions can deflect from the opening to form the depicted reentrant cavity 306. According to various embodiments, ion deflection from the reentrant cavity 306 can form a secondary cavity, ion deflection from the secondary cavity can form a tertiary cavity, or so forth. Thus, the hardmask layer 110 sub-layers can include various thicknesses according to a desired process and sidewall variation.

The etching of the stack 104 may be a high aspect ratio (HAR) etch, wherein the depth exceeds the width by at least 10, such as 25 or greater (e.g., 40, 50, and the like). The lower portion of the stack 104 may be somewhat tapered according to the etching process. Thus, a somewhat thinner hardmask may be selected to reduce the aspect ratio of the etch. Thick hardmasks may cause sidewall variation along a bottom surface of the stack 104 (as depicted in FIG. 3) and overly thin hardmasks may cause sidewall variation along an upper surface of the stack 104 (based on the reentrant cavity 306). A hardmask depth (or layer count/stack thickness) can be selected based on a local minimum where the sidewall variation at the bottom of the opening is about equal to the sidewall variation at the top of the sidewall etching.

Figure 12:
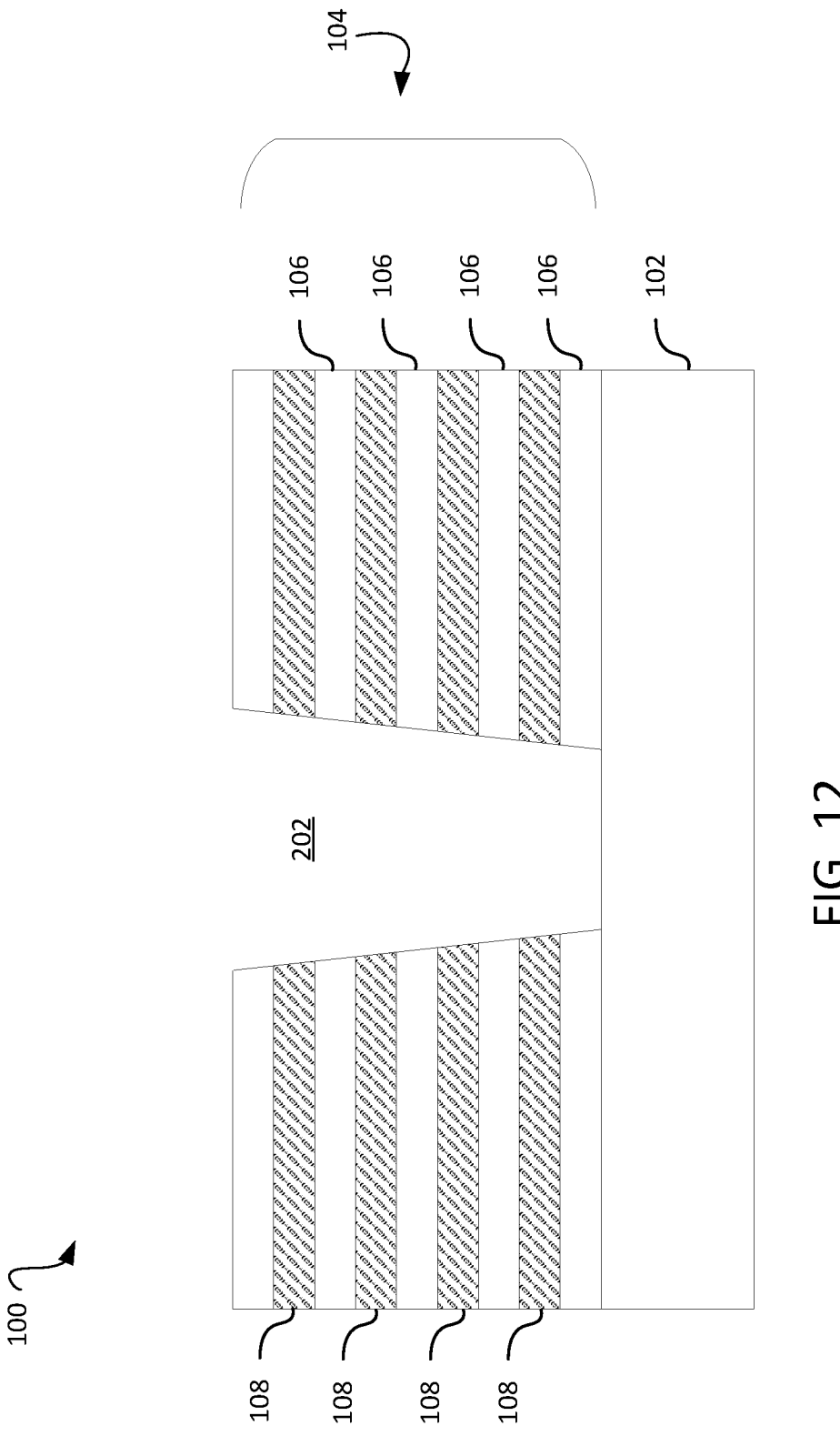

Corresponding to operation 512 of FIG. 5, FIG. 12 is a cross-sectional view of the semiconductor device 100 in which the hardmask layer 110 is removed, in accordance with various embodiments.

The hardmask layer 110 may be removed by a selective etching process which leaves the stack 104 substantially intact. As such, a top surface the stack 104 is exposed, along with the substrate 102 or etch stop layer formed there over by the openings 202. In some embodiments, a chemical mechanical grinding (CMG) process may be employed rather than or in addition to the etching process, such as wherein a selectivity of one or more etchants employed to remove the mask is low. For example, some embodiments employing oxide-nitride-oxide layers may have low selectivity between a tungsten-silicide mask and nitrides in the layers, such that a chemical mechanical process can be employed. In an similar embodiment substituting the oxide-nitride-oxide stack 104 for a thick oxide stack 104 an improved selectivity may be achieved, such that the chemical mechanical process can be substituted for an etching process. Indeed, various implementations of the present disclosure can be employed according to various geometries and chemistries of particular embodiments.

Following the removal of the hardmask, various connections can be formed between the various oxide layers 106 and nitride layers 108 of the stack 104. In some embodiments, further openings can be formed prior to, contemporaneously with, or subsequent to the operations of the depicted method 500 (e.g., slit and channel for a flash memory device). For example, various logic devices, memory devices, and other semiconductor devices 100 can be formed based on the systems and methods described herein.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for fabricating a semiconductor device, comprising:

forming a stack over a substrate;

forming a hardmask layer over the stack, the hardmask layer comprising a first tungsten containing sub-layer, the hardmask layer including at least one compressive sub-layer and at least one tensile sub-layer;

forming a patternable layer over the hardmask layer; and etching the hardmask layer according to the patternable layer to form an opening comprising an upper portion of a reentrant cavity disposed vertically above the stack and a lower portion comprising a first sidewall and a second sidewall opposite the first sidewall, a distance between the first sidewall and the second sidewall monotonically decreasing between an upper surface of the stack and the substrate of the semiconductor device.

2. The method of claim 1 wherein forming the hardmask layer comprises:

forming the first tungsten containing sub-layer over the stack;

forming a nitride sub-layer over the first tungsten containing sub-layer; and forming a second tungsten containing sub-layer over the nitride sub-layer, wherein the tungsten containing sub-layers are stressed opposite from the nitride sub-layers.

3. The method of claim 2, wherein the tungsten containing sub-layers comprise stressed elemental tungsten, tungsten silicide, tungsten nitride, tungsten carbide, or tungsten silicon nitride; and the nitride sub-layer comprises silicon nitride.

4. The method of claim 1, wherein the stack comprises one or more oxide layers comprising silicon dioxide, and comprising:

etching the stack based on the patterned hardmask layer.

5. The method of claim 4, wherein:

the one or more oxide layers are separated by alternating nitride layers; and the nitride layers comprise silicon nitride.

6. The method of claim 1, wherein the stack comprise alternating oxide layers and nitride layers, Tetraethyl orthosilicate (TEOS), or polysilicon.

7. The method of claim 1, wherein an aspect ratio of the etching process exceeds ten.

8. The method of claim 1, wherein the stack comprises at least 20 alternating oxide layers and nitride layers, a total thickness thereof exceeds 8 $\mu$m, and a hardmask layer thickness exceeds 0.5 $\mu$m.

9. The method of claim 1, wherein the etching is selective etching and extends from an upper surface of the hardmask layer to the substrate.

10. A method, for fabricating semiconductor devices, comprising:

forming a first tungsten-based layer over an upper surface of a semiconductor device stressed in a first mode;

forming a nitride layer stressed in a second mode opposite the first mode;

forming a second tungsten-based layer over the upper surface of a semiconductor device stressed in the first mode;

forming a patternable layer over the second tungsten-based layer;

etching the semiconductor device to form an opening through each of the first tungsten-based layer, the nitride layer, and the second tungsten-based layer, wherein the etching forms a reentrant cavity extending no lower than the first tungsten-based layer; and removing the first tungsten-based layer, the nitride layer, and the second tungsten-based layer.

11. The method of claim 10, wherein:

the first tungsten-based layer is formed over a plurality of dielectric layers of a stack;

the etching extends through the stack to a substrate.

12. The method of claim 11, further comprising:

forming conductive elements in the an opening; and connecting the plurality of dielectric layers of the stack of layers to form a memory device.

13. The method of claim 12, wherein the memory device is a NAND flash memory device.

14. The method of claim 12, wherein the memory device is a DRAM memory device.

15. The method of claim 11, wherein:

the tungsten-based layers comprise at least one of elemental tungsten, tungsten silicide, tungsten nitride, tungsten carbide, or tungsten silicon nitride; and the nitride layer comprises silicon nitride.

16. A method for fabricating a memory device, comprising:

(a) forming a stack over a substrate;

(b) forming a compressive layer over the substrate;

(c) forming a tensile layer over the substrate;

(d) alternating between each of (b) and (c) such that:

a total compressive stress exceeds a first stress constraint for the substrate;

a total tensile stress exceeds a second stress constraint for the substrate; and a net stress does not exceed the first stress constraint or the second stress constraint; and (e) etching the memory device from an upper surface to the stack, wherein the etching extends an opening though the stack, and includes forming a reentrant cavity disposed vertically above the stack.

17. The method of claim 16, wherein the stack comprises alternating oxide layers and nitride layers, wherein the nitride layers comprise a same material as the tensile layer.

18. The method of claim 16, wherein:

the compressive layers include elemental tungsten, tungsten silicide, tungsten nitride, tungsten carbide, or tungsten silicon nitride; and the tensile layers includes silicon nitride.

* * * * *